(12) United States Patent
Lv et al.

(10) Patent No.: US 9,935,131 B2
(45) Date of Patent: Apr. 3, 2018

(54) DISPLAY SUBSTRATE AND MANUFACTURING METHOD THEREOF, DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhenhua Lv, Beijing (CN); Lei Wang, Beijing (CN); Yanna Xue, Beijing (CN); Zhiying Bao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/148,083

(22) Filed: May 6, 2016

(65) Prior Publication Data
US 2017/0033123 A1 Feb. 2, 2017

(30) Foreign Application Priority Data
Jul. 29, 2015 (CN) .......................... 2015 1 0455386

(51) Int. Cl.
*H01L 27/12* (2006.01)
*H01L 21/768* (2006.01)
(Continued)

(52) U.S. Cl.
CPC ...... *H01L 27/124* (2013.01); *H01L 21/31111* (2013.01); *H01L 21/76802* (2013.01);
(Continued)

(58) Field of Classification Search
CPC .............. H01L 27/124; H01L 27/1259; H01L 27/1248; H01L 29/42356; H01L 21/31111; H01L 21/76802; H01L 21/76877
See application file for complete search history.

(56) References Cited

U.S. PATENT DOCUMENTS 7,352,426 B2 * 4/2008 Abe .................. G02F 1/136286
349/149
8,427,412 B2 * 4/2013 Wang ................ G02F 1/136286
345/92

(Continued)

FOREIGN PATENT DOCUMENTS

CN 102466931 A 5/2012
CN 104464603 A 3/2015

OTHER PUBLICATIONS

First Office Action dated Feb. 4, 2017 corresponding to Chinese application No. 201510455386.X.

*Primary Examiner* — Peniel M Gumedzoe
(74) *Attorney, Agent, or Firm* — Nath, Goldberg & Meyer; Joshua B. Goldberg; Annie Kock (57) ABSTRACT

The invention provides a display substrate and a manufacturing method thereof, and a display device. The display substrate comprises: a base, and gate lines and data lines, the data lines and the gate lines intersect with each other and are insulated from each other, the gate lines are electrically connected to a gate driver, the data lines are electrically connected to a source driver, the gate driver is provided at one side opposite to the source driver; gate signal lead-in lines, which are arranged parallel to the data lines; and an interlayer insulation layer provided between a layer in which the gate signal lead-in lines are arranged and a layer in which the gate lines are arranged, one end of each gate signal lead-in line is electrically connected to the gate driver, the
(Continued)

other end thereof is connected to a gate line through a via penetrating the interlayer insulation layer.

13 Claims, 6 Drawing Sheets

(51) Int. Cl.
    *H01L 21/311*     (2006.01)
    *H01L 29/423*     (2006.01)

(52) U.S. Cl.
    CPC .... *H01L 21/76877* (2013.01); *H01L 27/1248* (2013.01); *H01L 27/1259* (2013.01); *H01L 29/42356* (2013.01)

(56) References Cited

U.S. PATENT DOCUMENTS

| | | | |
|---|---|---|---|
| 8,723,758 B2* | 5/2014 | Li | G02F 1/13452 |
| | | | 345/55 |
| 2007/0120152 A1* | 5/2007 | Chang | G02F 1/133345 |
| | | | 257/270 |
| 2009/0296038 A1* | 12/2009 | Yoon | G02F 1/1339 |
| | | | 349/149 |
| 2010/0066967 A1* | 3/2010 | Takahashi | G02F 1/136286 |
| | | | 349/143 |
| 2013/0278487 A1* | 10/2013 | Hou | G09G 3/18 |
| | | | 345/87 |
| 2014/0043306 A1* | 2/2014 | Min | G09G 3/3685 |
| | | | 345/204 |
| 2016/0020224 A1* | 1/2016 | Kawamura | G02F 1/136286 |
| | | | 345/213 |

\* cited by examiner

Fig. 1

Prior Art

DISPLAY SUBSTRATE AND MANUFACTURING METHOD THEREOF, DISPLAY DEVICE

FIELD OF THE INVENTION

The present invention relates to the field of display technology, and particularly to a display substrate and a manufacturing method thereof, and a display device.

BACKGROUND OF THE INVENTION

A Thin Film Transistor-Liquid Crystal Display (TFT-LCD) displays a frame of image according to the following principle: a gate driving circuit sequentially inputs a square wave with a certain width into each row of pixels to gate the row of pixels from top to bottom, then a source driving circuit sequentially outputs a signal required by each row of pixels from top to bottom. At present, during manufacturing a display device with the above structure, the gate driving circuit and the source driving circuit are generally manufactured on a glass panel by a COF (Chip On Film) or a COG (Chip On Glass) process, however, in a case of high resolution, the numbers of outputs of the gate driving circuit and the source driving circuit are large, these driving circuits also have large size, which is disadvantageous to the bonding process for the module driving circuit.

In order to overcome the above problem, an existing manufacture of a display device adopts a design of GOA (Gate Drive On Array) circuit, which, compared with the existing COF or COG process, not only can save the cost, but also can realize an attractively design in which two sides of the display panel are symmetrical, meanwhile, bonding regions for the gate driving circuit and the peripheral wiring spaces can be saved, thus narrow bezel design of the display device can be realized, and the productivity and yield of the display devices can be increased.

Figure 1:
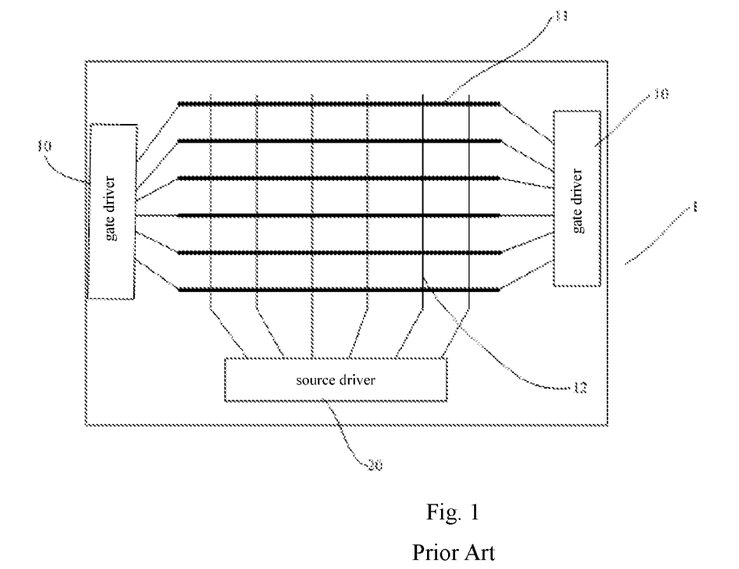
FIG. 1 is a diagram of a display substrate in the prior art.

Specifically, as shown in FIG. 1, a display substrate 1 comprises a plurality of gate lines 11 and a plurality of data lines 12 which intersect with each other and are insulated from each other, wherein a source driver 20 is provided at a bottom side of the display substrate 1 and is connected to the data lines 12 to supply data signals to the data lines 12. Gate drivers 10 are provided at a left side and a right side of the display substrate 1 to supply gate driving signals to the gate lines 11. However, the inventor finds that, the gate drivers 10 being provided at the left side and the right left of the display substrate 1 results in a wide left bezel and a wide right bezel of the display substrate 1, therefore, further narrowing the left bezel and the right bezel of the display substrate 1 has become a technical problem to be solved urgently.

SUMMARY OF THE INVENTION

In view of the above problem in which the left and right bezels of the existing display substrate are wide, the present invention provides a display substrate with narrow left and right bezels and a manufacturing method thereof, and a display device.

A technical solution adopted to solve the problem in the present invention is a display substrate, comprising: a base, and a plurality of gate lines and a plurality of data lines provided on the base, the plurality of data lines and the plurality of gate lines intersect with each other and are insulated from each other, the plurality of gate lines are electrically connected to a gate driver, and the plurality of data lines are electrically connected to a source driver, wherein the gate driver is provided at one side opposite to the source driver on the display substrate, and the display substrate further comprises: a plurality of signal lead-in lines, which are arranged parallel to a direction in which the data lines are arranged; and an interlayer insulation layer provided between a layer in which the gate signal lead-in lines are arranged and a layer in which the gate lines are arranged, and wherein one end of each of the gate signal lead-in lines is electrically connected to the gate driver, the other end thereof is connected to a gate line through a via penetrating the interlayer insulation layer, and the respective gate signal lead-in lines are connected to different gate lines.

Preferably, the data lines and the gate signal lead-in lines are provided in a same layer and made of a same material.

Preferably, every two adjacent data lines are provided therebetween with one of the gate signal lead-in lines, and the gate signal lead-in lines are evenly spaced.

Preferably, a layer in which the data lines are arranged is located below a layer in which the gate lines are arranged, and the two layers are spaced from each other by the gate insulation layer.

Preferably, the interlayer insulation layer comprises a first insulation layer and a second insulation layer, wherein a layer in which the data lines are arranged is located above a layer in which the gate lines are arranged, and these two layers are spaced from each other by the first insulation layer;

a layer in which the gate signal lead-in lines are arranged is located above the layer in which the data lines are arranged, and these two layers are spaced from each other by the second insulation layer.

Preferably, a layer in which the data lines are arranged is located above a layer in which the gate signal lead-in lines are arranged, and the two layers are spaced from each other by a planarization layer.

Preferably, projections of each of the gate signal lead-in lines and a data line corresponding to the gate signal lead-in line on the base completely coincide.

A technical solution adopted to solve the problem in the present invention is a manufacturing method of a display substrate, comprising: forming a plurality of gate lines and a plurality of data lines provided on a base so that the plurality of data lines and the plurality of gate lines intersect with each other and are insulated from each other, wherein the plurality of gate lines are electrically connected to a gate driver, the plurality of data lines are electrically connected to a source driver, wherein the gate driver is provided at one side opposite to the source driver on the display substrate, the manufacturing method further comprising:

forming an interlayer insulation layer above a layer in which the gate lines are arranged, and forming a plurality of vias in the interlayer insulation layer by etching;

forming a plurality of gate signal lead-in lines, which are arranged parallel to a direction in which the data lines are arranged, through a patterning process, wherein one end of each of the gate signal lead-in lines is electrically connected to the gate driver, the other end thereof is connected to a gate line through a via penetrating the interlayer insulation layer, and the respective gate signal lead-in lines are connected to different gate lines.

Preferably, the manufacturing method of a display substrate further comprises: forming a pattern of the plurality of data lines while forming the plurality of gate signal lead-in lines.

Preferably, every two adjacent data lines are provided therebetween with one of the gate signal lead-in lines, and the gate signal lead-in lines are evenly spaced.

Preferably, forming the plurality of gate lines and the plurality of data lines comprises:

forming a pattern including the plurality of data lines on the base through a patterning process;

forming a gate insulation layer; and forming a pattern including the plurality of gate lines through a patterning process.

Preferably, the interlayer insulation layer comprises a first insulation layer and a second insulation layer, and forming the plurality of gate lines and the plurality of data lines and forming the plurality of gate signal lead-in lines comprise:

forming a pattern including the plurality of gate lines on the base through a patterning process;

forming the first insulation layer;

forming a pattern including the plurality of data lines through a patterning process;

forming the second insulation layer, and forming vias penetrating the first insulation layer and the second insulation layer by etching; and forming a pattern including the plurality of gate signal lead-in lines through a patterning process, wherein the gate signal lead-in lines are connected to the gate lines through the vias penetrating the interlayer insulation layer, and the respective gate signal lead-in lines are connected to different gate lines.

Preferably, forming the plurality of gate lines and the plurality of data lines and forming the plurality of gate signal lead-in lines comprise:

forming a pattern including the plurality of gate lines on the base through a patterning process;

forming an interlayer insulation layer, and forming a plurality of vias in the interlayer insulation layer by etching;

forming a pattern including the plurality of gate signal lead-in lines through a patterning process, wherein the gate signal lead-in lines are connected to the gate lines through the vias penetrating the interlayer insulation layer, and the respective gate signal lead-in lines are connected to different gate lines;

forming a passivation layer; and forming a pattern including the plurality of data lines through a patterning process.

Preferably, projections of each of the gate signal lead-in lines and a data line corresponding to the gate signal lead-in line on the base completely coincide.

A technical solution adopted to solve the problem in the present invention is a display device, which comprises the above display substrate.

The invention has the following advantages:

In this invention, the gate driver is provided at one side opposite to the source driver, that is, the top side of the display substrate, at the same time, the gate signal lead-in lines are provided parallel to the data lines, so that no fallout region (for accommodating the gate signal lead-in lines and the gate drivers) is required at the left and right sides of the display substrate, and thus a bezel-less design can be realized at the left and right sides of the display substrate.

Reference numerals: 1. display substrate; 10. gate driver; 20. source driver; 11. gate line; 12. data line; 13. gate signal lead-in line; 21. interlayer insulation layer; 22. via; 23. first insulation layer; 24. second insulation layer; 25. planarization layer; 32. gate insulation layer.

DETAILED DESCRIPTION OF THE EMBODIMENTS

To make persons skilled in the art better understand the solutions of the present invention, the present invention will be described in details below in conjunction with the drawings and the implementations.

First Embodiment

The present embodiment provides a display substrate, comprising: a base, and a plurality of gate lines and a plurality of data lines provided on the base, the plurality of data lines and the plurality of gate lines intersect with each other and are insulated from each other, the plurality of gate lines are electrically connected to a gate driver, the plurality of data lines are electrically connected to a source driver, wherein the gate driver is provided at one side opposite to the source driver on the display substrate, and the display substrate further comprises: a plurality of gate signal lead-in lines, which are arranged parallel to a direction in which the data lines are arranged; and an interlayer insulation layer 21 provided between a layer in which the gate signal lead-in lines are arranged and a layer in which the gate lines are arranged, and wherein one end of each of the gate signal lead-in lines is electrically connected to the gate driver, the other end thereof is connected to a gate line through a via penetrating the interlayer insulation layer 21, and the respective gate signal lead-in lines are connected to different gate lines.

It should be understood that, the display substrate generally has four sides, that is, a top side, a bottom side, a left side and a right side, wherein the source driver is generally provided at the bottom side of the display substrate, the gate drivers are generally provided at the left side and the right side of the display substrate. In the present embodiment, the gate driver is provided at one side opposite to the source driver, that is, the top side of the display substrate, at the same time, the gate signal lead-in lines are provided parallel to the data lines, so that no fanout region (for accommodating the gate signal lead-in lines and the gate drivers) is required at the left and right sides of the display substrate, and thus a bezel-less design can be realized at the left and right sides of the display substrate. The following specific embodiments may be referred to.

Second Embodiment

Figure 2:
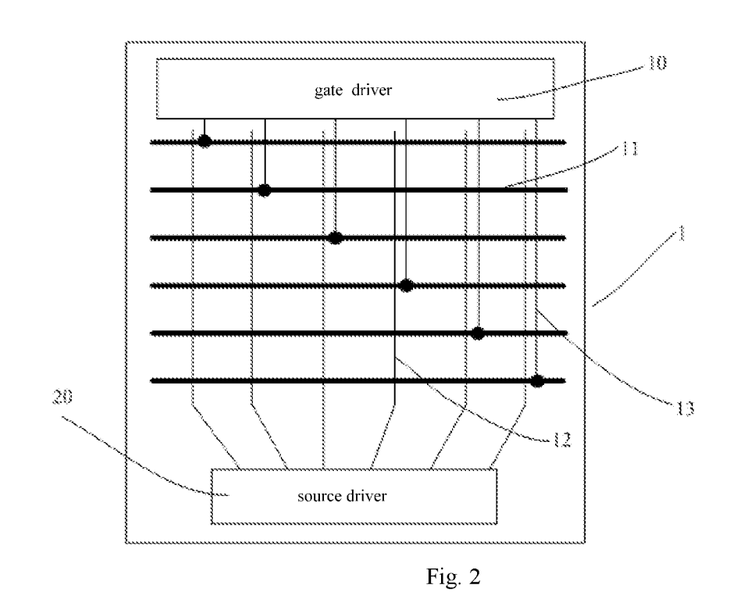
FIG. 2 is a diagram of a display substrate in a second embodiment in the present invention.

As shown in FIG. 2, the present embodiment provides a display substrate 1, which comprises: a base 2; and a plurality of gate lines 11, an interlayer insulation layer 21, a plurality of data lines 12 and a plurality of gate signal lead-in lines 13 provided on the base, the plurality of data lines 12 and the plurality of gate signal lead-in lines 13 are provide in a same layer and parallel to each other. The data lines 12 are electrically connected to the source driver 20 provided at the bottom side of the display substrate 1. In correspondence to each gate line 11, the interlayer insulation layer 21 above the gate lines is provided with a via, and the vias are not located on a same straight line. One end of each of the gate signal lead-in lines 13 is connected to a gate line through a via, and the other end thereof is connected to the gate driver 10 provided at the top side of the display substrate 1. It should be understood that, each gate signal lead-in line 13 is only connected to one gate line 11, and the respective gate signal lead-in lines 13 are connected to different gate lines 11.

The gate driver 10 and the source driver 20 of the display substrate 1 in the present embodiment are provided at the top side and the bottom side of the display substrate 1, respectively, and the gate signal lead-in lines 13 are parallel to a direction of the data lines 12, so that the left and right bezels of the display substrate 1 may be narrower, and even the bezel-less design of the display substrate 1 may be realized. Meanwhile, in the present embodiment, the data lines 12 and the gate signal lead-in lines 13 are provided in a same layer and made of a same material, therefore the data lines 12 and the gate signal lead-in lines 13 may be formed simultaneously by a single patterning process, thus the production cost of the display substrate 1 is not increased, and the manufacturing procedure is simple and easily to be realized.

Preferably, in the display substrate 1 of the present embodiment, every two adjacent data lines 12 are provided therebetween with a gate signal lead-in line 13, and the gate signal lead-in lines 13 are evenly spaced. That is to say, the data lines 12 and the gate signal lead-in lines 13 are alternately arranged, from the left to the right, on the display substrate 1. It should be understood that, such an arrangement enables the wirings on the display substrate 1 to be even, so that the display substrate 1 can display uniformly and has a better display effect.

Figure 4A:
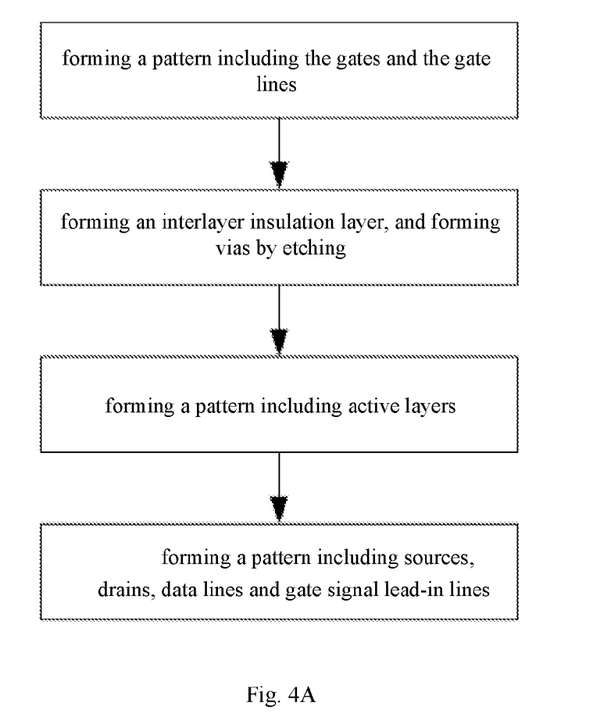
FIG. 4A is a flowchart of a manufacturing method of the display substrate in the second embodiment in the present invention.
Figure 4B:
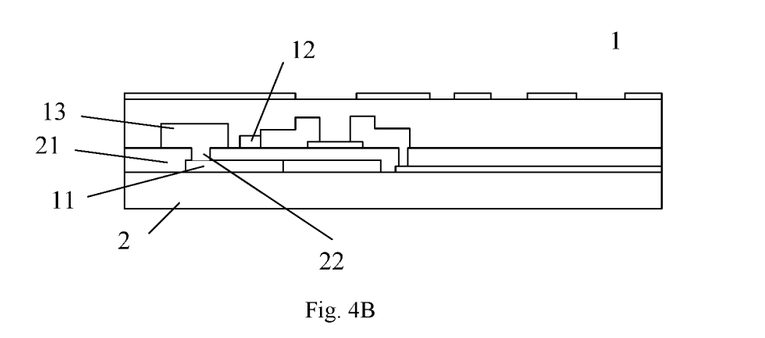
FIG. 4B is a cross section diagram of substrate manufactured in the second embodiment in the present invention.

As shown in FIGS. 4A and 4B, as for the above display substrate 1, the present embodiment further provides a manufacturing method of the display substrate 1, which comprises:

Step 1, forming a pattern including the gates of thin film transistors and the gate lines 11 on the base 2 through a patterning process.

Step 2, on the base subjected to the above step, forming an interlayer insulation layer 21, and forming vias for connecting the gate lines 11 to the gate signal lead-in lines 13 in the interlayer insulation layer by etching, meanwhile, forming vias for connecting drains of the thin film transistors to pixel electrodes.

Step 3, forming a pattern including active layers through a patterning process.

Step 4, on the base subjected to the above steps, forming a pattern including the sources and the drains of the thin film transistors, the data lines 12 and the gate signal lead-in lines 13 through a patterning process, wherein each drain is connected to a pixel electrode through a corresponding via, and each gate signal lead-in line 13 is connected to a corresponding gate line 11 through a via.

So far, the manufacture of the display substrate 1 is completed. It should be noted that, the manufacturing method of the display substrate 1 further comprises existing steps for forming the pixel electrodes and a common electrode, which will not be described in detail herein.

Third Embodiment

Figure 3:
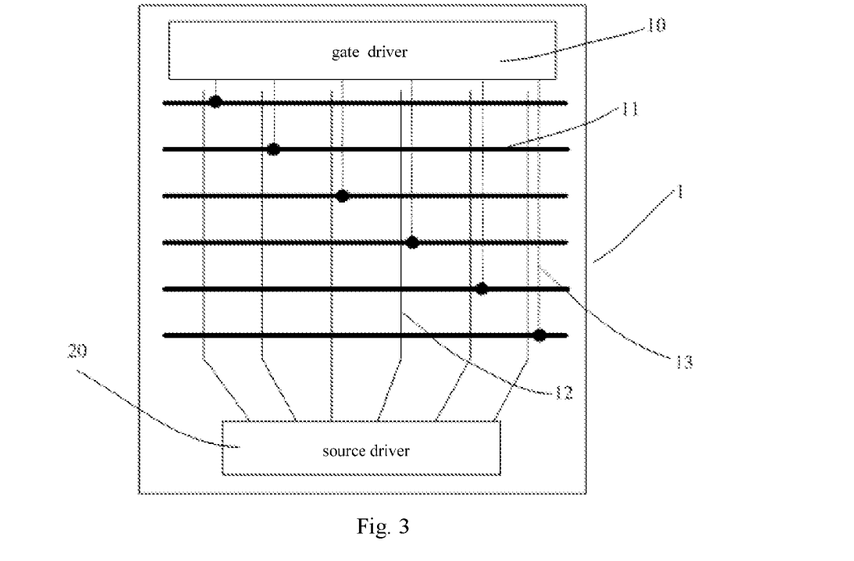
FIG. 3 is a diagram of a display substrate in a third embodiment in the present invention.

As shown in FIG. 3, the present embodiment provides a display substrate 1, which comprises a plurality of data lines 12, a gate insulation layer, a plurality of gate lines 11, an interlayer insulation layer and a plurality of gate signal lead-in lines 13 sequentially provided on a base, and the plurality of data lines 12 and the plurality of gate signal lead-in lines 13 are parallel to each other. The data lines 12 are electrically connected to the source driver 20 provided at the bottom side of the display substrate 1. In correspondence to each gate line 11, the interlayer insulation layer above the gate lines is provided with a via, and the vias are not located on a same straight line. One end of each of the gate signal lead-in lines 13 is connected to a gate line 11 through a via, and the other end thereof is connected to the gate driver 10 provided at the top side of the display substrate 1. It should be understood that, each gate signal lead-in line 13 is only connected to one gate line 11, and the respective gate signal lead-in lines 13 are connected to different gate lines 11.

The gate driver 10 and the source driver 20 of the display substrate 1 in the present embodiment are provided at the top side and the bottom side of the display substrate 1, respectively, and the gate signal lead-in lines 13 are parallel to a direction of the data lines 12, so that it is not required to provide gate drivers at the left and right sides of the display substrate 1, and thus the left and right bezels of the display substrate 1 may be narrower, and even the bezel-less design of the display substrate 1 may be realized.

Preferably, in the display substrate 1 of the present embodiment, projections of each of the gate signal lead-in lines 13 and a data line 12 corresponding to the gate signal lead-in line on the base completely coincide with each other, in the drawings, the dotted lines are only used to schematically show approximate positions of the gate signal lead-in lines 13, rather than show real positions of the gate signal lead-in lines 13. That is to say, the data lines 12 and the gate signal lead-in lines 13 are provided up and down in space in a one-to-one correspondence. Such an arrangement cannot influence the aperture ratio of the display panel, and moreover, the display substrate 1 of the present embodiment enables the left and right bezels of the display substrate 1 to be narrower so as to facilitate the high resolution design of the display substrate.

Figure 5A:
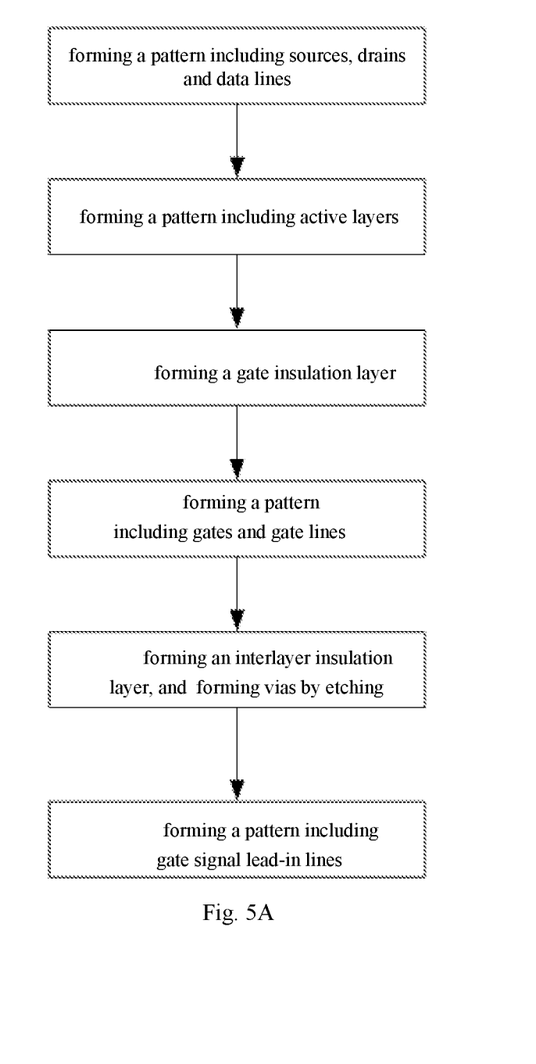
FIG. 5A is a flowchart of a manufacturing method of the display substrate in the third embodiment in the present invention.
Figure 5B:
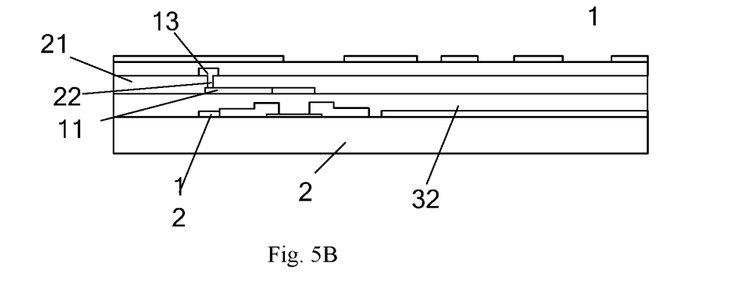
FIG. 5B is a cross section diagram of substrate manufactured in the third embodiment in the present invention.

As shown in FIGS. 5A and 5B, as for the above display substrate 1, the present embodiment further provides a manufacturing method of the display substrate 1, which comprises:

Step 1, forming a pattern including active layers of the thin film transistors on a base through a patterning process;

Step 2, on the base subjected to the above step, forming a pattern including the sources and drains of the thin film transistors and the data lines 12 through a patterning process.

Step 3, on the base subjected to the above steps, forming a gate insulation layer.

Step 4, on the base subjected to the above steps, forming a pattern including the gates and the gate lines 11 through a patterning process.

Step 5, on the base subjected to the above steps, forming the interlayer insulation layer, and forming vias for electrically connecting the gate lines 11 to the gate signal lead-in lines 13 in the interlayer insulation layer by etching.

Step 6, on the base subjected to the above steps, forming a pattern including the gate signal lead-in lines 13 through a patterning process, wherein the gate signal lead-in lines 13 are connected to the gate lines 11 through the vias.

Step 7, on the base subjected to the above steps, forming a passivation layer.

So far, the manufacture of the display substrate 1 is completed. It should be noted that, the manufacturing method of the display substrate 1 further comprises existing steps for forming the pixel electrodes and a common electrode, which will not be described in detail herein.

Fourth Embodiment

The present embodiment provides a display substrate 1, which comprises a plurality of gate lines 11, an interlayer insulation layer, a plurality of gate signal lead-in lines 13, a passivation layer and a plurality of data lines 12, which are sequentially provided on a base, wherein the plurality of data lines 12 and the plurality of gate signal lead-in lines 13 are parallel to each other. The data lines 12 are electrically connected to the source driver 20 provided at the bottom side of the display substrate 1. In correspondence to each gate line 11, the interlayer insulation layer above the gate lines is provided with a via, and the vias are not located on a same straight line. One end of each of the gate signal lead-in lines 13 is connected to a gate line 11 through a via, and the other end thereof is connected to the gate driver 10 provided at the top side of the display substrate 1. It should be understood that, each gate signal lead-in line 13 is only connected to one gate line 11, and the respective gate signal lead-in lines 13 are connected to different gate lines 11.

The gate driver 10 and the source driver 20 of the display substrate 1 in the present embodiment are provided at the top side and the bottom side of the display substrate 1, respectively, and the gate signal lead-in lines 13 are parallel to a direction of the data lines 12, so that it is not required to provide gate drivers at the left and right sides of the display substrate 1, and thus the left and right bezels of the display substrate 1 may be narrower, and even the bezel-less design of the display substrate 1 may be realized.

Preferably, in the display substrate 1 of the present embodiment, projections of each of the gate signal lead-in lines 13 and a data line 12 corresponding to the gate signal lead-in line on the base completely coincide with each other. That is to say, the data lines 12 and the gate signal lead-in lines 13 are provided up and down in space in a one-to-one correspondence. Such an arrangement cannot influence the aperture ratio of the display panel, and moreover, the display substrate 1 of the present embodiment enables the left and right bezels of the display substrate 1 to be narrower so as to facilitate the high resolution design of the display substrate.

Figure 6A:
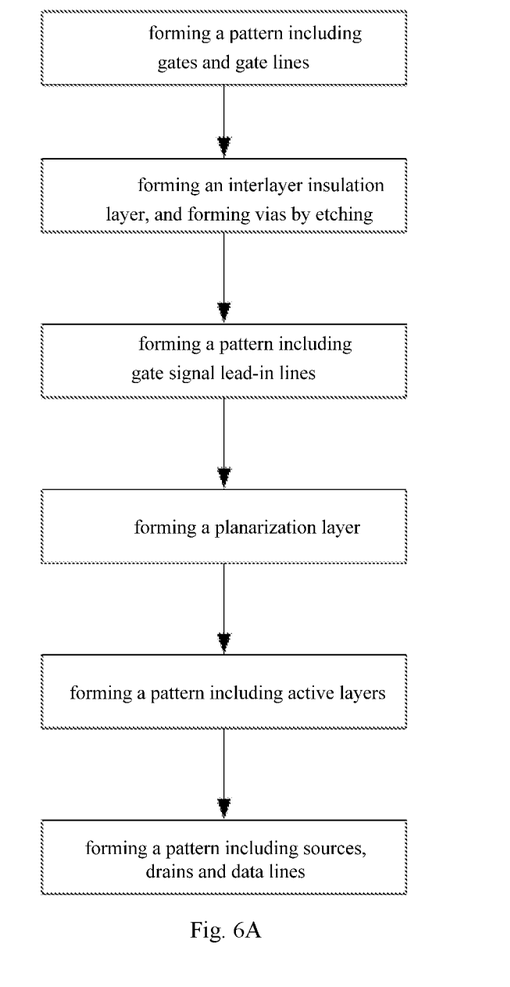
FIG. 6A is a flowchart of a manufacturing method of the display substrate in a fourth embodiment in the present invention.
Figure 6B:
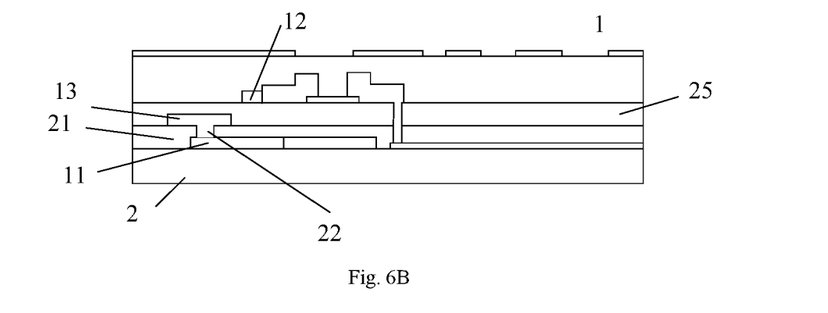
FIG. 6B is a cross section diagram of substrate manufactured in the fourth embodiment in the present invention.

As shown in FIGS. 6A and 6B, as for the above display substrate 1, the present embodiment further provides a manufacturing method of the display substrate 1, which comprises:

Step 1, forming a pattern including the gates of the thin film transistors and the gate lines 11 on the base 2 through a patterning process.

Step 2, on the base subjected to the above step, forming an interlayer insulation layer, and forming vias for connecting the gate lines 11 to the gate signal lead-in lines 13 in the interlayer insulation layer by etching.

Step 3, on the base subjected to the above steps, forming a pattern including the gate signal lead-in lines 13 through a patterning process, wherein the gate signal lead-in lines 13 are connected to the gate lines 11 through the vias.

Step 4, on the base subjected to the above steps, forming a planarization layer 25.

Step 5, on the base subjected to the above steps, forming a pattern including active layers of the thin film transistors through a patterning process;

Step 6, on the base subjected to the above steps, forming a pattern including the sources and drains of the thin film transistors and the data lines 12 through a patterning process.

So far, the manufacture of the display substrate 1 is completed. It should be noted that, the manufacturing method of the display substrate 1 further comprises existing steps for forming the pixel electrodes and a common electrode, which will not be described in detail herein.

Fifth Embodiment

The present embodiment provides a display substrate 1, which comprises a plurality of gate lines 11, a first insulation layer, a plurality of data lines 12, a second insulation layer and a plurality of gate signal lead-in lines 13, which are sequentially provided on the base, wherein the first insulation layer and the second insulation layer are collectively referred to as an interlayer insulation layer. The plurality of data lines 12 and the plurality of gate signal lead-in lines 13 are parallel to each other. The data lines 12 are electrically connected to the source driver 20 provided at the bottom side of the display substrate 1. In correspondence to each gate line 11, the interlayer insulation layer above the gate lines is provided with a via, and the vias are not located on a same straight line. One end of each of the gate signal lead-in lines 13 is connected to a gate line 11 through a via, and the other end thereof is connected to the gate driver 10 provided at the top side of the display substrate 1. It should be understood that, each gate signal lead-in line 13 is only connected to one gate line 11, and the respective gate signal lead-in lines 13 are connected to different gate lines 11.

The gate driver 10 and the source driver 20 of the display substrate 1 in the present embodiment are provided at the top side and the bottom side of the display substrate 1, respectively, and the gate signal lead-in lines 13 are parallel to a direction of the data lines 12, so that it is not required to provide gate drivers at the left and right sides of the display substrate 1, and thus the left and right bezels of the display substrate 1 may be narrower, and even the bezel-less design of the display substrate 1 may be realized.

Preferably, in the display substrate 1 of the present embodiment, projections of each of the gate signal lead-in lines 13 and a data line 12 corresponding to the gate signal lead-in line on the base completely coincide with each other. That is to say, the data lines 12 and the gate signal lead-in lines 13 are provided up and down in space in a one-to-one correspondence. Such an arrangement cannot influence the aperture ratio of the display panel, and moreover, the display substrate 1 of present embodiment enables the left and right bezels of the display substrate 1 to be narrower so as to facilitate the high resolution design of the display substrate.

Figure 7A:
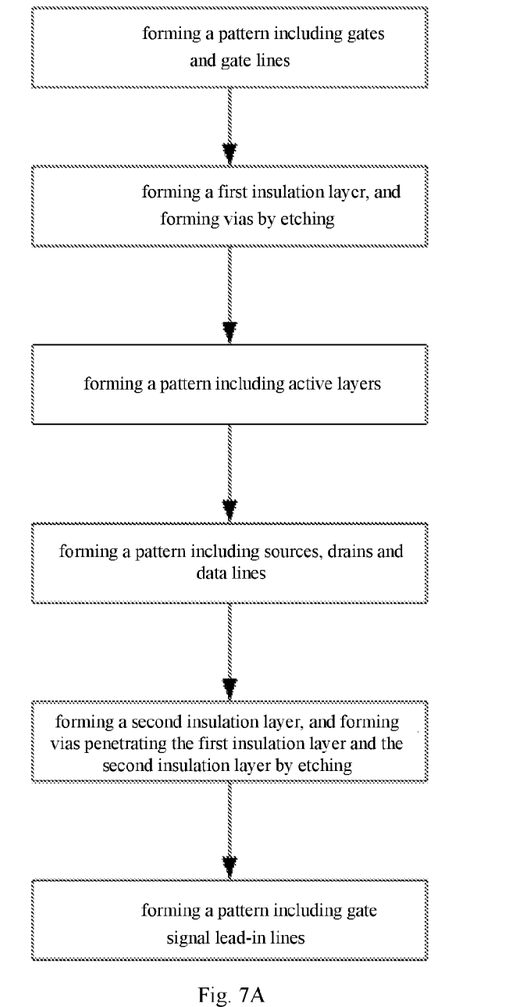
FIG. 7A is a flowchart of a manufacturing method of the display substrate in a fifth embodiment in the present invention.
Figure 7B:
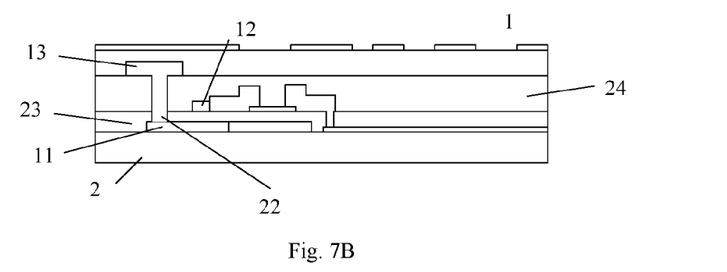
FIG. 7B is a cross section diagram of substrate manufactured in the fifth embodiment in the present invention.

As shown in FIGS. 7A and 7B, as for the above display substrate 1, the present embodiment further provides a manufacturing method of the display substrate 1, which comprises:

Step 1, forming a pattern including the gates of the thin film transistors and the gate lines 11 on the base 2 through a patterning process.

Step 2, on the base 2 subjected to the above step, forming the first insulation layer 23.

Step 3, on the base subjected to the above steps, forming a pattern including active layers of the thin film transistors through a patterning process.

Step 4, on the base subjected to the above steps, forming a pattern including the sources and drains of the thin film transistors and the data lines 12 through a patterning process.

Step 5, on the base subjected to the above steps, forming the second insulation layer 24, and forming vias 22 for connecting the gate lines 11 to the gate signal lead-in lines 13 in the first insulation layer and the second insulation layer by etching.

So far, the manufacture of the display substrate 1 is completed. It should be noted that, the manufacturing method of the display substrate 1 further comprises existing steps for forming the pixel electrodes and a common electrode, which will not be described in detail herein.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

The invention claimed is:

1. A display substrate, comprising: a base, and a plurality of gate lines and a plurality of data lines provided on the base, the plurality of data lines and the plurality of gate lines intersect with each other and are insulated from each other, the plurality of gate lines are electrically connected to a gate driver, and the plurality of data lines are electrically connected to a source driver, wherein the gate driver is provided at one side opposite to the source driver on the display substrate; and the display substrate further comprises a plurality of gate signal lead-in lines, which are arranged parallel to a direction in which the data lines are arranged, and an interlayer insulation layer provided between a layer in which the gate signal lead-in lines are arranged and a layer in which the gate lines are arranged, and wherein one end of each of the gate signal lead-in lines is electrically connected to the gate driver, another end thereof is connected to a gate line through a via penetrating the interlayer insulation layer, and respective gate signal lead-in lines are connected to different gate lines, wherein a layer in which the data lines are arranged is located below a layer in which the gate lines are arranged, and the two layers are spaced from each other by a gate insulation layer, and the layer in which the data lines are arranged is between the layer in which the gate lines are arranged and the base.

2. The display substrate of claim 1, wherein the data lines and the gate signal lead-in lines are made of a same material.

3. The display substrate of claim 2, wherein projections of each of the gate signal lead-in lines and a data line corresponding to the gate signal lead-in line on the base completely coincide.

4. A display device comprising the display substrate of claim 1.

5. The display substrate of claim 1, wherein projections of each of the gate signal lead-in lines and a data line corresponding to the gate signal lead-in line on the base completely coincide.

6. A manufacturing method of a display substrate, comprising: forming a plurality of gate lines and a plurality of data lines provided on a base so that the plurality of data lines and the plurality of gate lines intersect with each other and are insulated from each other, wherein the plurality of gate lines are electrically connected to a gate driver, the plurality of data lines are electrically connected to a source driver, wherein the gate driver is provided at one side opposite to the source driver on the display substrate, the manufacturing method further comprising:

forming an interlayer insulation layer above a layer in which the gate lines are arranged, and forming a plurality of vias in the interlayer insulation layer by etching;

forming a plurality of gate signal lead-in lines, which are arranged parallel to a direction in which the data lines are arranged, through a patterning process, wherein one end of each of the gate signal lead-in lines is electrically connected to the gate driver, the other end thereof is connected to a gate line through a via penetrating the interlayer insulation layer, and the respective gate signal lead-in lines are connected to different gate lines, wherein a layer in which the data lines are arranged is located below a layer in which the gate lines are arranged, and the two layers are spaced from each other by a gate insulation layer, and the layer in which the data lines are arranged is between the layer in which the gate lines are arranged and the base.

7. The manufacturing method of a display substrate of claim 6, further comprising: forming a pattern of the plurality of data lines while forming the plurality of gate signal lead-in lines.

8. The manufacturing method of a display substrate of claim 7, wherein every two adjacent data lines are provided therebetween with one of the gate signal lead-in lines, and the gate signal lead-in lines are evenly spaced.

9. The manufacturing method of a display substrate of claim 6, wherein every two adjacent data lines are provided therebetween with one of the gate signal lead-in lines, and the gate signal lead-in lines are evenly spaced.

10. The manufacturing method of a display substrate of claim 6, wherein forming the plurality of gate lines and the plurality of data lines comprises:

forming a pattern including the plurality of data lines on the base through a patterning process;

forming a gate insulation layer; and forming a pattern including the plurality of gate lines through a patterning process.

11. The manufacturing method of a display substrate of claim 6, wherein the interlayer insulation layer comprises a first insulation layer and a second insulation layer, and forming the plurality of gate lines and the plurality of data lines and forming the plurality of gate signal lead-in lines comprise:

forming a pattern including the plurality of gate lines on the base through a patterning process;

forming the first insulation layer;

forming a pattern including the plurality of data lines through a patterning process;

forming the second insulation layer, and forming vias penetrating the first insulation layer and the second insulation layer by etching; and forming a pattern including the plurality of gate signal lead-in lines through a patterning process, wherein the gate signal lead-in lines are connected to the gate lines through the vias penetrating the interlayer insulation layer, and the respective gate signal lead-in lines are connected to different gate lines.

12. The manufacturing method of a display substrate of claim 6, wherein forming the plurality of gate lines and the plurality of data lines and forming the plurality of gate signal lead-in lines comprise:

forming a pattern including the plurality of gate lines on the base through a patterning process;

forming an interlayer insulation layer, and forming a plurality of vias in the interlayer insulation layer by etching;

forming a pattern including the plurality of gate signal lead-in lines through a patterning process, wherein the gate signal lead-in lines are connected to the gate lines through the vias penetrating the interlayer insulation layer, and the respective gate signal lead-in lines are connected to different gate lines;

forming a passivation layer;

forming a pattern including the plurality of data lines through a patterning process.

13. The manufacturing method of a display substrate of claim 6, wherein projections of each of the gate signal lead-in lines and a data line corresponding to the gate signal lead-in line on the base completely coincide.

\* \* \* \* \*